US011755539B2

(12) United States Patent
Zhang et al.

(10) Patent No.: US 11,755,539 B2
(45) Date of Patent: Sep. 12, 2023

(54) BIG DATA PROCESSING METHOD BASED ON DIRECT COMPUTATION OF COMPRESSED DATA

(71) Applicant: Renmin University of China, Beijing (CN)

(72) Inventors: Feng Zhang, Beijing (CN); Xiaoyong Du, Beijing (CN)

(73) Assignee: RENMIN UNIVERSITY OF CHINA, Beijing (CN)

( * ) Notice: Subject to any disclaimer, the term of this patent is extended or adjusted under 35 U.S.C. 154(b) by 0 days.

(21) Appl. No.: 17/744,833

(22) Filed: May 16, 2022

(65) Prior Publication Data

US 2022/0300465 A1   Sep. 22, 2022

Related U.S. Application Data

(63) Continuation of application No. PCT/CN2022/077227, filed on Feb. 22, 2022.

(30) Foreign Application Priority Data

Mar. 22, 2021   (CN) .......................... 202110301350.1

(51) Int. Cl.
*G06F 16/174* (2019.01)
(52) U.S. Cl.
CPC ................. *G06F 16/1744* (2019.01)
(58) Field of Classification Search
CPC ................................................. G06F 16/1744
See application file for complete search history.

(56) References Cited

U.S. PATENT DOCUMENTS 6,230,184 B1 * 5/2001 White ..................... G06F 9/445
  709/201
6,327,699 B1 * 12/2001 Larus ................... G06F 11/3612
  714/E11.22

(Continued)

OTHER PUBLICATIONS

Zhang et al., "Zwift: A Programming Framework for High Performance Text Analytics on Compressed Data", ACM (Year: 2018).*

(Continued)

*Primary Examiner* — Irete F Ehichioya
*Assistant Examiner* — Huen Wong
(74) *Attorney, Agent, or Firm* — HAUPTMAN HAM, LLP

(57) ABSTRACT

A big data processing method based on direct computation of compressed data. The method includes 1) compressing, based on a modified Sequitur compression method, original input data according to a smallest compression granularity given by an user, and transforming them into a directed acyclic graph, DAG, consisting of digits; and 2) determining an optimal traversal pattern, and performing a top-downward traversal or a bottom-upward traversal on the DAG in the step 1) based on the determined optimal traversal pattern so as to enable direct processing of the compressed data. By providing a modified Sequitur algorithm and top-downward and bottom-upward traversal strategies in the disclosure, direct processing of compressed data is enabled, significant improvement in time and space has been gained with broad applicability, and certain representations with respect to more advanced document analytics can still be derived on the basis of these.

5 Claims, 2 Drawing Sheets

(56) References Cited

U.S. PATENT DOCUMENTS

| | | | |
|---|---|---|---|
| 6,971,092 B1* | 11/2005 | Chilimbi | G06F 11/3471 |
| | | | 714/E11.203 |
| 11,188,846 B1* | 11/2021 | He | G06N 5/022 |
| 2003/0041093 A1* | 2/2003 | Yamane | G06F 11/0709 |
| | | | 709/224 |
| 2003/0167402 A1* | 9/2003 | Stolfo | H04L 51/212 |
| | | | 726/23 |
| 2005/0192917 A1* | 9/2005 | Lubbers | G06F 16/93 |
| 2006/0070047 A1* | 3/2006 | Narayanasamy | G06F 8/443 |
| | | | 717/144 |
| 2009/0254575 A1* | 10/2009 | Kravets | H03M 7/40 |
| 2010/0017373 A1* | 1/2010 | Harada | G06F 16/166 |
| | | | 707/E17.014 |
| 2011/0098972 A1* | 4/2011 | Chen | G06F 17/11 |
| | | | 712/30 |
| 2011/0106526 A1* | 5/2011 | Nguyen | G06F 40/30 |
| | | | 704/9 |
| 2011/0270853 A1* | 11/2011 | Curbera | G06F 16/9024 |
| | | | 707/812 |
| 2015/0067695 A1* | 3/2015 | Hamamoto | G06F 9/5066 |
| | | | 718/104 |
| 2015/0281076 A1* | 10/2015 | Zhang | H04L 45/02 |
| | | | 370/392 |
| 2016/0246896 A1* | 8/2016 | Arora | G06F 16/9535 |
| 2017/0316025 A1* | 11/2017 | Shekhar | G06F 16/148 |
| 2021/0334663 A1* | 10/2021 | Shen | G06N 3/082 |

OTHER PUBLICATIONS

Zhang et al., "Efficient Document Analytics on Compressed Data: Method, Challenges, Algorithms, Insights", Proceedings of the VLDB Endowment (Year: 2018).*

Zhang et al., "Potential of A Method for Text Analytics Directly on Compressed Data", Renmin University of China (Year: 2017).*

Zhang et al., "TADOC: Text analytics directly on compression", Springer (Year: 2020).*

Kieffer, "A Survey of Advances in Hierarchical Data Compression", University of Minnesota (Year: 2000).*

First Office Action issued in corresponding Chinese Application No. 202110301350.1; dated Aug. 4, 2021; 24 pgs.

Zhang, Feng, et al.; TADOC: Text analytics directly on compression; The VLDB Journal (2021) 30:163-188.

* cited by examiner

BIG DATA PROCESSING METHOD BASED ON DIRECT COMPUTATION OF COMPRESSED DATA

RELATED APPLICATIONS

The present application is a U.S. Continuation of International Application Number PCT/CN2022/077227 filed Feb. 22, 2022, and claims priority to Chinese Application Number 202110301350.1 filed Mar. 22, 2021, the disclosure of which is hereby incorporated by reference herein in its entirety.

FIELD OF THE INVENTION

The present disclosure relates to a big data processing method based on direct computation of compressed data, which belongs to the technical field of big data processing.

BACKGROUND OF THE INVENTION

One of the key features of big data is its huge and rapidly growing data capacity, which brings intense pressure in space and time to data storage and computation of a big data management system. Data processing is critical for many applications, from web searches to system diagnostics, security, and others. Under the background of today's big data era, a huge amount of data is generated every day, which brings great challenges to both storage space and processing time.

Big data processing mainly faces two aspects of challenges: first, along with the huge amount of data, storage overhead is also very large; second, it takes a quite long time to process the large-scale data. Especially in the case that the processed data keeps growing rapidly, data analysis is extremely time-consuming and often requires a lot of storage space and memory space. Among them, a common method to alleviate space-related problems is data compression. So far, there are many data compression algorithms, such as LZ77, suffix arrays, and their variants. However, these algorithms in use further require decompression, steps of which have prolonged end-to-end processing time, so that the challenge in the aspect of processing time cannot be worked out.

SUMMARY OF THE INVENTION

Technical Problem to be Solved

In view of the above problems, an objective of the present disclosure is to provide a big data processing method based on direct computation of compressed data. The method researches on a hierarchical structure of a compressed result by means of a modified Sequitur compression algorithm, and can directly carry out data processing under a compressed state.

Technical Solutions

In order to achieve the objective above, the present disclosure adopts a technical solution of a big data processing method based on direct computation of compressed data, which comprises steps of:

1) based on a modified Sequitur compression method, compressing original input files according to a smallest compression granularity given by an user, and transforming them into a DAG consisting of digits; and 2) determining an optimal traversal pattern, and performing a top-downward traversal or a bottom-upward traversal on the DAG in the step 1) based on the determined optimal traversal pattern so as to enable direct processing of the compressed data.

Further, in the step 1), when the original input files are subjected to data compression, flowing steps are included:

1.1) judging a quantity of the original input files, wherein if the quantity of the original input files is greater than 1, the respective original input files are inserted with preset file separators thereamong and then stored as one input file to serve as a file to be compressed; otherwise, directly using the original input file as a file to be compressed and proceeding to step 1.2);

1.2) scanning the file to be compressed in the step 1.1), and digitizing respective pieces of data of the smallest compression granularity in the scanned file to be compressed to obtain a data dictionary; and 1.3) compressing the data dictionary based on the modified Sequitur algorithm, and transforming a digit string resulted from compression into a DAG for representation.

Further, in the step 1.2), a method for digitizing the data in the file to be compressed includes: replacing each piece of newly appearing data of the smallest compression granularity in the file to be compressed with a digit, and recording a relationship between the piece of data of the smallest compression granularity and the digit.

Further, in the step 1.3), a method for compressing the data dictionary based on the modified Sequitur algorithm, and transforming a digit string resulted from compression into a DAG for representation includes steps of:

1.3.1) creating a piece of blank rule S, and inputting respective digits into the rule S in turn according to content of input data that has been replaced by the digits;

1.3.2) traversing the rule S in which the digits have been input;

1.3.3) upon an appeared digit has been paired with another, judging whether the pair of digits is a piece of rule, if not, a piece of new rule is created based on the pair of digits and the newly created rule is added to the data dictionary, and then the pair of digits in the input rule S is replaced with the new rule; if so, it means that the pair of digits identically refers to a piece of rule that has been established, and the pair of digits is replaced with this rule then;

1.3.4) repeating the steps 1.3.2) to 1.3.3) until the traversal is over; for a rule that is only used once, removing this rule and replacing it with an original pair of digits; and 1.3.5) transforming a digital string resulted from the compression and obtained in the step 1.3.4) into a directed acyclic graph (DAG) for representation.

Further, in the step 2), a method for determining the optimal traversal pattern includes:

first, randomly extracting a preset proportion of sample data from the original input files;

then, performing compression and transformation on the sample data by using the modified Sequitur compression method in the step 1) to obtain a DAG corresponding to the sample data; and finally, processing the obtained DAG through both a top-downward traversal pattern and a bottom-upward traversal pattern, and determining either the top-downward or bottom-upward traversal pattern as the optimal traversal pattern according to a processing speed.

Further, when the obtained DAG is subjected to a traversal through the top-downward traversal pattern, included are steps of:

S1, counting statistically incoming edges of each node in the DAG, recording the incoming edges of each node in the DAG as rule.InEdgeN and a quantity of edges at each node that have been processed as rule.EdgeProcessed, and initializing a value of mask of the root node rule.mask to true and values of masks of other rules rule.mask to false;

S2, determining a quantity of threads according to a quantity of nodes so that each thread is responsible for one node to keep updating weights weight of child nodes of each node until no value changes any more during the traversal of the DAG; and S3, collecting desired data from each node and summarizing a final result.

Further, in the step S2, a method for determining a quantity of threads according to a quantity of nodes so that each thread is responsible for one node to keep updating weights weight of child nodes of each node until no value changes any more during the traversal of the DAG, includes steps of:

S2-1, judging a value of the mask rule.mask of each node, if the value of rule.mask is true, proceeding to step S2-2; otherwise, performing no operation; and when none of the nodes are operated, quitting iteration and proceeding to step S3;

S2-2, setting subrule.EdgeProcessed of a child node of said node to 0, and updating a weight subrule.weight of the child node; an update formula is subrule.weight+=subrule.Frequency*thisrule.weight;

S2-3, increasing the quantity of edges of the child node that have been processed subrule.EdgeProcessed by 1;

S2-4, if the quantity of edges of the child node that have been processed subrule.EdgeProcessed plus 1 is equal to the incoming edges of the child node subrule.InEdgeN, then setting the mask of the child node subrule.mask to true, and proceeding to step S2-5; otherwise, returning to the step S2-1 to continue to update the weights; and S2-5, setting a value of the mask of the current node rule.mask to false.

Further, when the obtained DAG is subjected to a traversal through the bottom-upward traversal pattern, included are steps of:

S1, analyzing the nodes and the incoming edges of the DAG, and preforming initialization on each parameter based on a statistically analyzed result;

S2, traversing the DAG from bottom to top until traversed values in the DAG no longer change; and S3, collecting desired data from the root node and the second-level nodes, and summarizing a final result.

Further, in the step S1, a method for initializing each parameter includes steps of:

S1-1, allocating a space size of parent node to each rule;

S1-2, creating a pointer pointing to the parent node for each rule;

S1-3, setting mask rule.mask for each rule;

S1-4, transferring a size of local table from bottom to top, and generating, for each rule, data of spaces that are created for collecting data from bottom to top; and S1-5, initializing rule.mask of each rule.

Further, in the step S2, a method for traversing the DAG from bottom to top until traversed values in the DAG no longer change includes steps of:

S2-1, judging a value of mask of each node, if the value of mask rule.mask of a node is true, then a plurality of nodes enter step S2-2 in parallel; if the value of mask of the node is false, no operation is performed, wherein upon values of mask of all nodes are false, quitting iteration and jumping to the step S1-3;

S2-2, merging and storing elements contained in each node in its own local table;

S2-3, for each child node subrule of each node, multiplying local table of the child node subrule by the related weight weight and then merging a product into local table of said rule;

S2-4, for each parent node parent of said node, performing steps of:

S2-4-1, incrementing parent.edges by 1; and

S2-4-2, if parent.edges plus 1 is equal to the quantity of outgoing edges of parent node, then recording parent.mask as true, and proceeding to step S2-5; otherwise, returning to the step S2-1; and S2-5, setting rule.mask of the current rule to false.

Beneficial Effect

1. The present disclosure proposes an algorithm in the process of data processing under a multi-core CPU or a distributed environment. By providing a modified Sequitur algorithm, analysis of two types of documents are worked out, significant improvement in time and space has been gained with broad applicability, and certain representations with respect to more advanced document analysis can still be derived on the basis of these;

2. By designing the top-downward and bottom-upward traversal strategies in the present disclosure, the processing of compressed data can also be applicable to GPU so that a document analysis method for parallel processing on GPU is worked out, compressed data is processed in a direct manner, and time and space complexity of the algorithm has been further improved. The GPU has features of high performance-per-cost ratio and high energy consumption, and can be directly applied to analysis of a large amount of data, which significantly improves the performance of direct processing of compressed data;

3. In the modified Sequitur algorithm of the present disclosure, distinctive recognition for different input files is enabled by inserting special file separators in the root node so that duplicated data between the files can be reused, thereby improving compression efficiency;

Therefore, the present disclosure can be widely applied in the field of data processing.

DETAILED DESCRIPTION OF THE EMBODIMENTS

Figure 1:
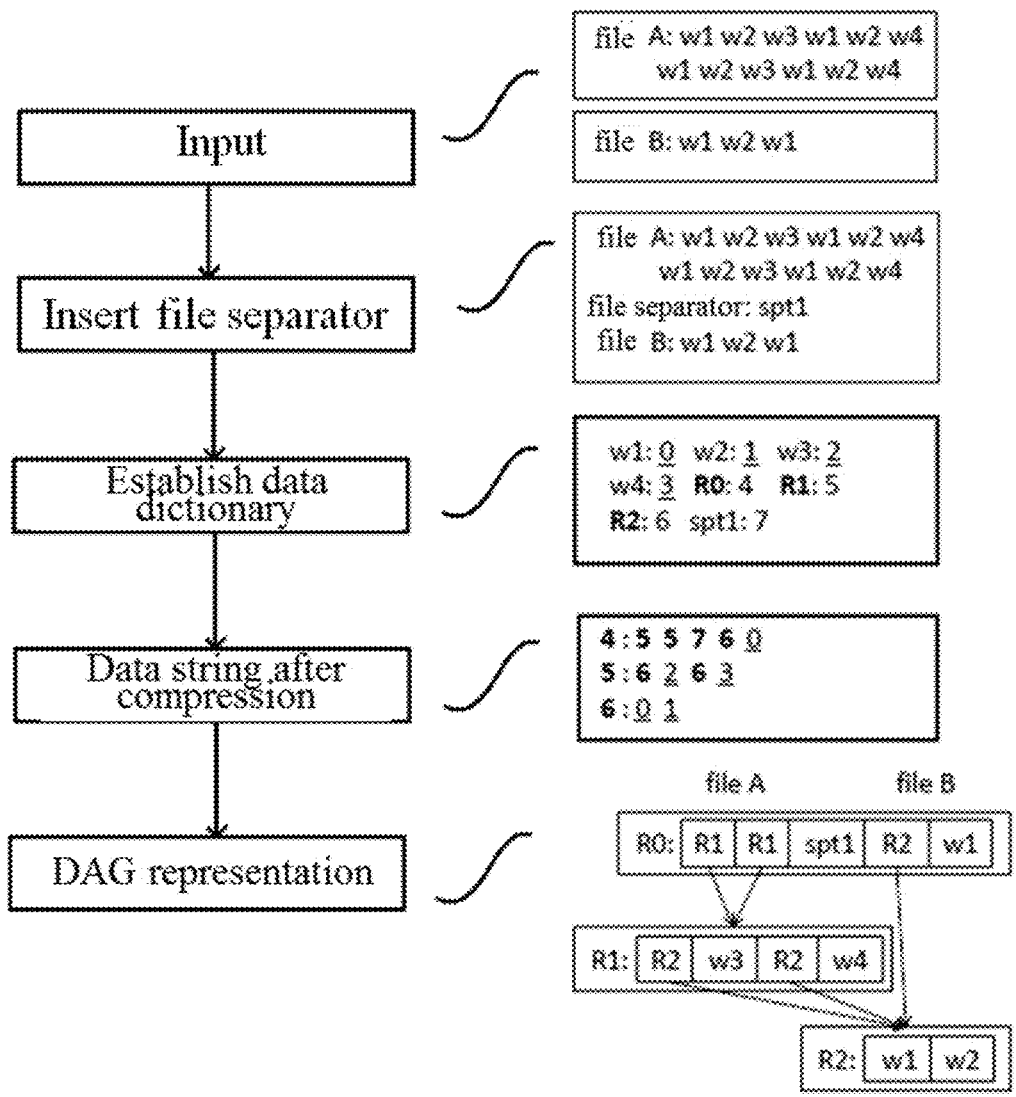
FIG. 1 is a flowchart of a big data processing method based on direct computation of compressed data according to an embodiment of the present disclosure.
Figure 2:
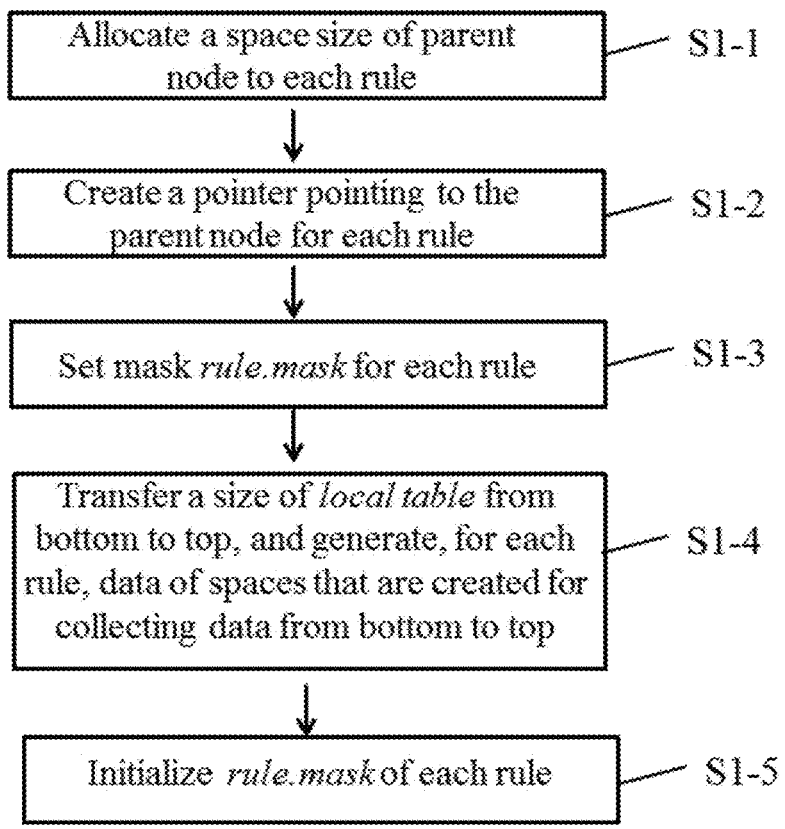
FIG. 2 is a flowchart of an initialization sequence S1-1 to S1-5 performed on each parameter based on a statistically analyzed result.

For better understanding of the technical conception of the present disclosure by those skilled in the art, the present disclosure will be described in detail through specific embodiments. However, it should be understood that the specific embodiments are provided only for better understanding of the present disclosure, and should not be construed as limitation to the present disclosure. In the description of the present disclosure, it is to be understood that terms used are for illustrative purpose only and should not be construed to indicate or imply relative importance.

After analyzing the existing compression algorithms, it is found in the present disclosure that a compression method described based on grammar rules can be adopted to compress data, and the compressed data can be directly processed without decompressing the data simply by parsing the grammar rules. Since a compressed outcome resulted by grammar rules of Sequitur algorithm is suitable for direct processing, direct processing of compressed data has been achieved in the present disclosure by performing modification to the Sequitur algorithm. The Sequitur algorithm is a kind of recursive algorithm that deducts a hierarchical structure from a sequence of discrete symbols. For a given sequence of discrete symbols that is derived from a context-free grammar (CFG), each rule in the CFG tends to exhaustively shrink duplicate strings into a rule ID, and then replaces the original strings by the rule ID to output a more compact dataset. In this case, the CFG can be abstracted into a directed acyclic graph (DAG). Therefore, parsing of the grammar rules can be transformed into traversal of this DAG.

However, in data processing related to the traversal of DAG, there are many challenges faced during effective implementation of direct processing of compressed data. These challenges involve the trade-off between reuse of data processing results from different rules and overhead of data transmission among DAG nodes during traversal of the DAG. If the benefit of the data reuse is greater than that of the data transmission overhead among DAG traversal nodes, then there will be performance benefits; otherwise, there will be performance losses.

Specific challenges therefrom are as following: first, default Sequitur compression cannot distinguish a recognition file from the others and cannot reuse duplicate data between the recognition files; second, a pattern for result propagation is required to take into account an order of words in an input document so as to accommodate order guarantees for order-sensitive applications, especially how to guarantee the order in the case that a word sequence spans a plurality of nodes; third, for datasets with different properties, individual designs can be required in terms of propagated contents and the entire traversal algorithms; fourth, compression-based direct processing has introduced certain mutual dependencies among the nodes, so that it is difficult to design a parallel processing algorithm.

In order to achieve the key objective of the present disclosure, i.e., "maximize reuse while minimize overhead", the present disclosure provides a solution to the above-mentioned multiple challenges, specifically, including: first, inserting special file separators into a root node; second, designing a data structure, which is particularly useful for processing of unit sensitivity; third, by designing top-downward and bottom-upward traversal strategies, enhancing adaptability of the algorithms in case of different data being input; fourth, designing a suitable parallel algorithm, which can adapt to parallel computing in multi-core CPU, GPU, and distributed systems.

In the present disclosure, a method for directly processing compressed data based on parsing of grammar rules is provided. The main idea thereof is to use interpretable grammar rules to describe data, and then process the data under a non-decompressed state according to parsing of the grammar rules. The present disclosure discusses in detail how to compress the data with a user-given granularity based on a modified Sequitur compression algorithm, including: data compression, a top-downward processing algorithm, a bottom-upward processing algorithm, and how to make selection between the algorithms. The parallel algorithm can be used in scenarios, such as multi-core CPU, GPU, and distributed systems. The present disclosure is very effective for both processing overhead reduction and compression ratio maximization.

The present disclosure provides a big data processing method based on direct computation of compressed data, in which when data compression is performed, by modifying the Sequitur compression method, a data compression granularity is modified so that compression can be performed according to a granularity given by a user, such as a word granularity; at the same time, in a multi-file environment, a plurality of files are inserted with special file separators thererbetween and stored together; then, a data dictionary is established, the modified Sequitur algorithm is called, and with respect to the given data granularity, different grammar rules and the smallest data granularity (for example, words) are mapped to digits, so that original input data is transformed into a DAG consisting of digits. Then, when the compressed data is processed, a top-downward traversal of DAG and a bottom-upward traversal of DAG are adopted to implement direct processing of compressed data.

Specifically, following steps are included:

1) Data compression: based on a modified Sequitur compression method, original input data is compressed in terms of the smallest compression granularity given by a user, and is transformed into a DAG consisting of digits.

It is assumed that the smallest compression granularity required by the user is in word, the following steps are included when the original input data is subjected to the data compression:

1.1) Inserting file separator: the number of original input files is determined, if the number of original input files is greater than 1, respective original input files are inserted with preset file separators therebetween and then stored as one input file so as to serve as a file to be compressed; otherwise, directly proceeding to step 1.2);

1.2) Establishing a data dictionary: the file to be compressed obtained in the step 1.1) is scanned, and respective data of the smallest compression granularity in the scanned file to be compressed is digitized to obtain the data dictionary.

Specifically, a method for digitizing the data in the file to be compressed includes: replacing each piece of newly appearing data of the smallest compression granularity in the file to be compressed with a digit, and recording a relationship between the piece of data of the smallest compression granularity and the digit.

When the data dictionary is established, it is usually counted from 0. If a file to be compressed has n words in total, then the largest vocabulary entry in the obtained data dictionary is n−1; if the file to be compressed can be represented by k pieces of rules, then the digits at nth to (n+k−1)th represent the rules, respectively; if there are m original input files in total, then m−1 different file separators are inserted among the original input files and the file separators are represented by items at (n+k)th to (n+k+m−2)th in the data dictionary.

As shown in FIG. 1, there are two original input files, namely file A and file B, wi refers to a word corresponding to the file A/file B, Ri refers to a related rule, and spti refers to a file separator. In FIG. 1, a file separator spt1 is inserted between the two input files A and B; different words are replaced with varied digits, that is, using digits 0-3 to represent words w1-w4; the number of word types are recorded, i.e., 4 types of words; then, three pieces of rules R0, R1, R2 are generated, which are represented by digits 4, 5, and 6, respectively; and as there are two files, there is one file separator spt1, which is described by a digit 7.

1.3) Compressing the data dictionary in the step 1.2) based on the modified Sequitur algorithm, and transforming a compressed digital string into a DAG for representation, which specifically includes following steps 1.3.1) to 1.3.5):

1.3.1) Creating a piece of blank rule S, and inputting respective digits into the rule S in turn according to the content of the input data replaced by the digits;

1.3.2) Traversing the rule S in which the digits has been input;

1.3.3) Upon an appeared digit has been paired with the other, judging whether the pair of digits is a piece of rule:

If not, a piece of new rule is created based on the pair of digits and the new created rule is added to the data dictionary, and then the pair of digits in the input rule S is replaced with the new rule;

If so, it means that the pair of digits identically refers to a piece of rule that has been established, and the pair of digits is replaced with this rule then;

1.3.4) Repeating the steps 1.3.2) to 1.3.3) until the traversal is over; for a rule that is only used once, removing this rule and replacing it with an original pair of digits; and 1.3.5) Transforming a digital string resulted from the compression and obtained in the step 1.3.4) into a directed acyclic graph (DAG) for representation.

As shown in FIG. 1, respective rules are generated according to the extended Sequitur algorithm. For example, digits in the first row are 4: 5 5 7 6 0, and it can be seen by looking up the data dictionary that rule R0 is equal to an element string "R1 R1 spt1 R2 w1"; digits in the second row are 5: 6 2 6 3, and it can be seen by looking up the data dictionary that rule R1 is equal to an element string "R2 w3 R2 w4"; then the compressed digit string is represented as a DAG, and the data thereof can be recovered by traversing the DAG.

The above modified Sequitur algorithm can be described as:

---

1. Scan a file, replace each piece of newly appeared data of the smallest granularity (such as a word) with a digit, and record a relationship between the word and the digit. Count from 0, if there are n words, then the largest vocabulary entry in the digital dictionary is numbered as n−1;
2. If a plurality of files are compressed together, insert special file separators among the files; if there are m files, insert m−1 different file separators among the files. Items at (n+k)th to (n+k+m−2)th in the data dictionary represent the file separators;
3. Create a piece of blank rule S, and input respective digits into the rule S in turn according to the content of the input data replaced by the digits, after every digit has been entered:
4.    Traverse S, upon an appeared digit has been paired with the other:
5.       if: if this pair of digits is not a piece of rule:
6.          then create a piece of new rule, add it into the dictionary, and replace the pair of digits in the input S with the new rule;
7.       else: if it is found that the pair of digits identically refers to a piece of rule that has been established, then replace the pair of digits with the rule;
8. When the traversal ends, for a rule that is used only once:
9.    Remove the rule and replace it with the original pair of digits;

---

2) Processing of compressed data: determining an optimal traversal pattern, and performing, based on the determined optimal traversal pattern, a top-downward traversal or a bottom-upward traversal on the DAG in the step 1) to implement direct processing of compressed data.

A method for determining the optimal traversal pattern includes that:

First, a small package of sample data is randomly extracted from the file to be compressed, for example, 10% of the data of the file to be compressed can be randomly extracted as the sample data;

Then, the modified Sequitur compression method in the step 1) is used to compress and transform the sample data to obtain a DAG corresponding to the sample data; and Finally, the DAG corresponding to the sample data is directly processed by both the top-downward and bottom-upward traversal patterns, and either the top-downward or bottom-upward traversal pattern is determined as the optimal traversal pattern according to their processing speed.

The important innovation in the data compression of the present disclosure is adopting the modified Sequitur algorithm to compress the data and transform it into a DAG, and proposing the related top-downward and bottom-upward traversal patterns. First, the essence of the DAG traversal of the present disclosure is parsing of grammar rules, and data structures of nodes and edges are more complex, for example, each node maintains relevant information of the rules. Second, each node in the DAG represents a different rule in which there is a unit of data elements that are maintained in order. Third, additional cumulative information is transferred during the traversal, such as a frequency of a word, etc.

In the case that the top-downward traversal pattern is used to perform a traversal on the DAG in the step 1), a root node is first divided into different segments, and then different threads are responsible for one of the segments, respectively, and then perform traversals from top to bottom in parallel. For a given rule, it first transfers its cumulative weight to all sub-rules. If the number of inner edges is now equal to the number of all inner edges in the sub-rules, then a mask is marked to indicate that the sub-rules are ready to be traversed in a next round.

First, parameters used are explained as follows:

rule/subrule: rule refers to a rule, and subrule refers to a sub-rule of the current rule;

InEdgeN: an incoming edge of each rule, that is, the number of other rules that point to said rule; referring to FIG. 1, in the case that another rule points to said rule for multiple times, only once is counted;

EdgeProcessed: the number of processed rules that point to said rule; when EdgeProcessed==InEdgeN, it means that the rule can be processed in the next round;

mask: for determining whether said rule can be processed (true means yes, false means no);

weight: a weight of the rule, that is, actual total times of appearance of the rule;

Frequency: the number of times that the rule appears in its parent rule.

Specifically, following steps are included:

S1, incoming edges of each node in the DAG are counted statistically. As each node in the DAG represents one piece of rule rule, the incoming edges of each node in the DAG are recorded as rule.InEdgeN, and the number of edges at each node that have been processed is recorded as rule.EdgeProcessed, and a value of mask of the root node rule.mask is initialized to true, and values of masks of other rules rule.mask are initialized to false;

S2, the number of threads is determined according to the number of nodes (rules), so that each thread is responsible for one node (i.e., rule) to update weights weight (i.e., the number of times the sub-rule appears in the rule) of child nodes (i.e., child rules) of each node (i.e., each rule) until no value changes any more during the traversal of the DAG, which specifically includes following steps S2-1 to S2-5:

S2-1, Judging a value of the mask rule.mask of each node, if the value of rule.mask is true, proceeding to step S2-2, otherwise, performing no operation; and when none of the nodes are operated, quitting the iteration and proceeding to step S3;

S2-2, Setting subrule.EdgeProcessed of a child node of the node to 0, and updating a weight subrule.weight of the child node; an update formula is subrule.weight+=subrule.Frequency*thisrule.weight That is, the weight of the child node subrule.weight is added by the product of the number of times of the sub-rule appearing in the currently processed rule subrule.Frequency and the weight of the current rule thisrule.weight;

S2-3, Increasing the number of edges of the child node that have been processed subrule.EdgeProcessed by 1;

S2-4, If the number of edges of the child node that have been processed subrule.EdgeProcessed plus 1 is equal to the incoming edges of the child node subrule.InEdgeN, setting the mask of the child node subrule.mask to true, and proceeding to step S2-5; otherwise, returning to the step S2-1 to continue to update the weights; and S2-5, Setting the value of the mask of the current node rule.mask to false; and S3, Collecting desired data from each node, such as statistics of word frequency, and summarizing a final result.

A top-downward data analysis algorithm corresponding to the above-mentioned top-downward traversal pattern includes:

mask to indicate whether this rule needs to be processed in this round of loop. Only when all sub-rules of a rule have been processed, the related mask can be set to true. When a certain piece of rule is processed, results obtained by the rule and its sub-rules are merged together. Specifically, it includes the following steps S1 to S3.

S1, The nodes and the incoming edges of the DAG are analyzed, and initialization is performed on each parameter based on a statistically analyzed result;

When initialization is performed, it includes S1-1 to S1-5:

S1-1, Allocating a space size of parent node to each rule;

S1-2, Creating a pointer pointing to the parent node for each rule;

S1-3, Setting mask rule.mask for each rule;

S1-4, Transferring a size of local table from bottom to top, and generating, for each rule, data of spaces that are created for collecting data from bottom to top; and S1-5, Initializing rule.mask of each rule;

S2, Traversing the DAG from bottom to top until traversed values in the DAG no longer change. Specifically, it includes the following steps S2-1 to S2-5:

S2-1, Judging a value of mask of each node, if the value of mask rule.mask of a node is true, then a plurality of nodes enter step S2-2 in parallel; if the value of mask of the node is false, no operation is performed; upon values of masks of all nodes are false (that is, none of the nodes are operated), quitting the iteration and jumping to the step S1-3;

S2-2, Merging and storing elements contained in each node in its own local table;

S2-3, For each child node subrule of each node, multiplying local table of the child node subrule by the related weight weight and then merging the product into local table of the rule;

S2-4, For each parent node parent of this node, performing steps of S2-4-1 to S2-4-2, S2-4-1, Incrementing parent.edges by 1; and S2-4-2, If parent.edges plus 1 is equal to the number of outgoing edges of parent node, then recording parent.mask as true, and proceeding to step S2-5; otherwise, returning to the step S2-1; and S2-5, Setting rule.mask of the current rule to false;

S3, Collecting the desired data, such as statistics of word frequency, from the root node and the second-level nodes, and summarizing a final result.

---

1. For each rule rule (node) in the DAG, calculate incoming edges of each rule in the DAG, and record them in rule.InEdgeN;
2. Set the number of edges of each node that have been processed rule.EdgeProcessed to 0;
3. Set rule.mask of the root node to true, and set values of rule.mask of other rules to false;
4. do
5.     Each thread is responsible for one piece of rule, which is recorded as thisrule;
6.     if thisrule.mask == false:
7.        return;
8.     for each subrule in thisrule:
9.        subrule.weight + = subruleFrequency*thisrule.weight;
10.       subrule.EdgeProcessed+ = 1;
11.       if (subrule.EdgeProcessed+ 1) == subrule.InEdgeN:
12.          subrule.mask = true
13.     thisrule.mask = false;
14. while DAG still changes;
15. Collect data and summarize a result

---

In the case that the bottom-upward pattern is used to perform a traversal on the DAG in the step 1), first, each node is assigned with one thread, and each node has a related A bottom-upward data analysis algorithm corresponding to the above-mentioned bottom-upward traversal pattern includes:

```
1. Allocate a space size of parent node to each rule;
2. Create a pointer pointing to the parent node for each rule;
3. Set rule.mask for each rule;
4. Transfer a size of local table from bottom to top, and for each rule, generate
data of spaces that are created for collecting data from bottom to top;
5. Initialize rule.mask of each rule;
6. do
7.     Each thread is responsible for one piece of rule, which is recorded as
thisrule;
8.     if  thisrule.mask == false:
9.        return;
10.    Merge and store elements contained in each rule in its own localtable;
11.    for each subrule:
12.       thisrule.localtable.add(element, elementFrequency*subruleFrequency);
13.       threadfence( );
14.    for each parent:
15.       parent.edges + = 1;
16.       if(parent.edges+ 1) == parent.outedges:
17.          parent.mask = true;
18.    thisrule.mask = false;
19. while DAG still changes;
20. Collect desired data, such as statistics of word frequency, from the root node
and the second-level nodes, and summarize a final result;
```

Finally, it should be noted that the above embodiments are intent to provide illustration only for the technical solutions of the present disclosure, instead of limitation thereto. Although the present disclosure has been described in detail with reference to the above embodiments, it should be understood by those of ordinary skill in the art that modifications or equivalent replacements still can be made to the specific embodiments of the present disclosure, and any modifications or equivalent replacements that do not depart from the spirit and scope of the present disclosure shall be covered within the protection scope of the claims of the present disclosure. The above contents are only specific embodiments of the present application, but the protection scope of the present application is not limited thereto. Any changes or replacements that are conceivable to a person skilled in the art and familiar with the pertinent field according to technical scope disclosed in the present application should fall within the scope of protection of this application. Therefore, the protection scope of the present application should comply with the protection scope of the claims.

What is claimed is:

1. A big data processing method based on direct computation of compressed data, comprising steps of:
1) compressing, based on a modified Sequitur compression method, at least one original input file according to a smallest compression granularity given by a user, and transforming the at least one original input file into a directed acyclic graph, DAG, consisting of digits;
wherein in step 1), when subjecting the at least one original input file to data compression using the modified Sequitur compression method includes steps:
1.1) determining a number of the at least one original input file,
wherein if the number of the at least one original input file is greater than 1, respective at least one original input files are inserted with preset file separators thereamong and then stored as one composite input file to serve as a file to be compressed, wherein inserting with the preset file separators comprises inserting special file separators in a root node to reuse duplicated data between the respective at least one original input file; and
wherein if the number of the at least one original input file is 1, directly using the at least one original input file as the file to be compressed and proceeding to step 1.2);
1.2) scanning the file to be compressed in step 1.1) and digitizing respective pieces of data of the smallest compression granularity in the scanned file to be compressed to obtain a data dictionary; and
1.3) compressing the data dictionary based on the modified Sequitur algorithm and transforming a digit string resulted from compression into the DAG for representation, and
2) determining an optimal traversal pattern and performing a top-downward traversal or a bottom-upward traversal on the DAG in step 1) based on the determined optimal traversal pattern to perform direct processing of the compressed data,
wherein in step 2), determining the optimal traversal pattern, includes steps:
2.1) first, randomly extracting sample data comprising a preset proportion of the at least one original input file;
2.2) then, performing compression and transformation on the sample data by using the modified Sequitur compression method in step 1) to obtain a DAG corresponding to the sample data; and
2.3) finally, processing the obtained DAG corresponding to the sample data through both a top-downward traversal pattern and a bottom-upward traversal pattern, and determining either the top-downward or bottom-upward traversal pattern as the optimal traversal pattern according to their processing speed,
wherein when the obtained DAG corresponding to the sample data is subjected to a traversal through the bottom-upward traversal pattern, included are the steps of:
S1, analyzing the nodes and the incoming edges of the obtained DAG, and performing initialization on each parameter based on a statistically analyzed result,
wherein in step S1, performing initialization on each parameter includes performing steps:
S1-1, allocating a space size of parent node to each rule;
S1-2, creating a pointer pointing to the parent node for each rule;
S1-3, setting mask rule.mask for each rule;

S1-4, transferring a size of local table from bottom to top, and generating, for each rule, data of spaces that are created for collecting data from bottom to top; and S1-5, initializing rule.mask of each rule;

S2, traversing the DAG from bottom to top until traversed values in the DAG no longer change;

wherein in step S2, traversing the DAG from bottom to top until traversed values in the DAG no longer change includes performing the steps of:

S2-1, determining a value of mask rule.mask of each node, if the value of mask rule.mask of a node is true, then a plurality of nodes enter step S2-2 in parallel;

if the value of mask rule.mask of the node is false, no operation is performed, wherein upon values of mask rule.mask of all nodes are false, quitting iteration and jumping to step S1-3;

S2-2, merging and storing elements contained in each node in its own local table;

S2-3, for each child node subrule of each parent node, multiplying local table of the child node subrule by the related weight and then merging a product into local table of said rule;

S2-4, for each parent node parent of said node, performing steps of:

S2-4-1, incrementing parenl.edges by 1; and

S2-4-2, if parent.edges plus 1 is equal to the quantity of outgoing edges of parent node, then recording parent.mask as true, and proceeding to step S2-5; otherwise, returning to the step S2-1; and S2-5, setting rule.mask of the current rule to false; and S3, collecting desired data from the root node and second-level nodes, and summarizing a final result.

2. The big data processing method based on direct computation of compressed data according to claim 1, wherein in the step 1.2), digitizing the data in the file to be compressed, includes:

replacing each piece of newly appearing data of the smallest compression granularity in the file to be compressed with a digit; and recording a relationship between the piece of data of the smallest compression granularity and the digit.

3. The big data processing method based on direct computation of compressed data according to claim 1, wherein in the step 1.3), compressing the data dictionary based on the modified Sequitur algorithm and transforming a digit string resulted from compression into a DAG for representation includes steps of:

1.3.1) creating a piece of blank rule S, and inputting respective digits into the blank rule S in turn according to content of input data that has been replaced by the digits to obtain a rule S;

1.3.2) traversing the rule S obtained in which the digits have been input;

1.3.3) upon an appeared digit has been paired with another, judging whether the pair of digits is a piece of rule, if not, a piece of new rule is created based on the pair of digits and the newly created rule is added to the data dictionary, and then the pair of digits in the rule S is replaced with the new rule; if so, it means that the pair of digits identically refers to a piece of rule that has been established, and the pair of digits is replaced with the established rule then;

1.3.4) repeating the steps 1.3.2) to 1.3.3) until the traversal is over; for a rule that is used only once, removing said rule and replacing it with an original pair of digits; and 1.3.5) transforming a digital string resulted from the compression and obtained in the step 1.3.4) into a DAG for representation.

4. The big data processing method based on direct computation of compressed data according to claim 1, wherein when the obtained DAG is subjected to a traversal through the top-downward traversal pattern, wherein:

S1 further comprises counting statistically incoming edges of each node in the DAG, recording the incoming edges of each node in the DAG as rule.InEdgeN and a quantity of edges at each node that have been processed as rule.EdgeProcessed, and initializing a value of mask of a root node rule.mask to true and values of masks of other rules rule.mask to false;

S2 further comprises determining a quantity of threads according to a quantity of nodes so that each thread is responsible for one node to keep updating weights weight of child nodes of each node until no value changes any more during the traversal of the DAG; and S3 further comprises collecting desired data from each node and summarizing a final result.

5. The big data processing method based on direct computation of compressed data according to claim 4, wherein determining a quantity of threads according to a quantity of nodes so that each thread is responsible for one node to keep updating weights weight of child nodes of each node until no value changes any more during the traversal of the DAG, wherein:

S2-1 further comprises determining a value of the mask rule.mask of each node, if the value of rule.mask is true, proceeding to step S2-2; otherwise, performing no operation, wherein when none of the nodes are operated, quitting iteration and proceeding to step S3;

S2-2 further comprises setting subrule.EdgeProcessed of a child node of said node to 0, and updating a weight subrule.weight of the child node, wherein an update formula is subrule.weight +=subrule.Frequency * this-rule.weight;

S2-3 further comprises increasing the quantity of edges of the child node that have been processed subrule.EdgeProcessed by 1;

S2-4 further comprises if the quantity of edges of the child node that have been processed subrule.EdgeProcessed plus 1 is equal to the incoming edges of the child node subrule.InEdgeN, then setting the mask of the child node subrule.mask to true, and proceeding to step S2-5; otherwise, returning to the step S2-1 to continue to update the weights; and S2-5 further comprises setting a value of the mask of the current node rule.mask to false.

* * * * *